(12) United States Patent
Roziere et al.

(10) Patent No.: US 10,710,252 B2
(45) Date of Patent: Jul. 14, 2020

(54) ROBOT EQUIPPED WITH CAPACITIVE DETECTION MEANS AND ITEM(S) REFERENCED TO A GUARD POTENTIAL

(71) Applicant: FOGALE NANOTECH, Nîmes (FR)

(72) Inventors: Didier Roziere, Nîmes (FR); Frédéric Ossart, Langlade (FR)

(73) Assignee: FOGALE NANOTECH, Nimes (FR)

( * ) Notice: Subject to any disclaimer, the term of this patent is extended or adjusted under 35 U.S.C. 154(b) by 0 days.

(21) Appl. No.: 16/066,277

(22) PCT Filed: Jul. 26, 2017

(86) PCT No.: PCT/FR2017/052087
§ 371 (c)(1),
(2) Date: Jun. 26, 2018

(87) PCT Pub. No.: WO2019/020874
PCT Pub. Date: Jan. 31, 2019

(65) Prior Publication Data
US 2020/0171680 A1    Jun. 4, 2020

(51) Int. Cl.
| | |
|---|---|
| *B25J 19/02* | (2006.01) |
| *B25J 13/08* | (2006.01) |
| *H03K 17/955* | (2006.01) |
| *B25J 19/06* | (2006.01) |

(52) U.S. Cl.
CPC .......... *B25J 19/027* (2013.01); *B25J 13/086* (2013.01); *B25J 13/087* (2013.01); *B25J 19/06* (2013.01); *H03K 17/955* (2013.01); *H03K 2217/0027* (2013.01)

(58) Field of Classification Search
CPC .................................................... B25J 19/027
USPC ........... 318/568.16, 568.11, 568.1, 567, 560
See application file for complete search history.

(56) References Cited

U.S. PATENT DOCUMENTS

| | | |
|---|---|---|
| 5,166,679 A | 11/1992 | Vranish et al. |
| 5,363,051 A | 11/1994 | Jenstrom et al. |
| 2019/0286261 A1* | 9/2019 | Neel .................... G06F 3/0416 |

FOREIGN PATENT DOCUMENTS

WO    2014/101943 A1    7/2014

OTHER PUBLICATIONS

International Search Report from International Patent Application No. PCT/FR2017/052087, dated Apr. 18, 2018.

(Continued)

*Primary Examiner* — David Luo
(74) *Attorney, Agent, or Firm* — Greer, Burns & Crain, Ltd.

(57) ABSTRACT

The invention relates to a robot including capacitive detection electrodes, at least one means of electrical polarization for polarizing the measurement electrodes at a first alternating electrical potential different from a general ground potential (MG), at a frequency, called working frequency.
The robot is characterized in that, for at least one sub-part, called fitted-out the outer wall of which is at least partially non-electrically conductive, said at least one polarization means is also arranged in order to electrically guard the electrical items of said fitted-out sub-part at an alternating electrical potential ($V_G$), called guard potential, identical or substantially identical to said first potential, at said working frequency.

16 Claims, 7 Drawing Sheets

(56) References Cited

OTHER PUBLICATIONS

Written Opinion of the International Searching Authority from International Patent Application No. PCT/FR2017/052087, dated Apr. 18, 2018.

* cited by examiner

FIG. 1: PRIOR ART

ROBOT EQUIPPED WITH CAPACITIVE DETECTION MEANS AND ITEM(S) REFERENCED TO A GUARD POTENTIAL

BACKGROUND

The present invention relates to a robot equipped with capacitive detection means, and at least one electrical item of which is electrically referenced to a guard potential different from a general ground potential.

The field of the invention is, non-limitatively, that of the field of robotics, in particular the field of industrial robotics or service robots, for example medical or domestic, or also collaborative robots, also called "cobots".

Industrial or domestic robots, in particular cobots, generally comprise a body on which a functional head is fastened, presented in the form of a tool or of a tool-holder, allowing them to carry out one or more tasks in an environment.

These robots are involved in more and more applications, either completely autonomously, or assisting a person or an operator. They are generally equipped with sensors allowing them to detect the objects and persons located in their environment, with a view to ensuring the safety of the robot and also of the nearby objects and persons. These sensors can be provided using capacitive detection electrodes.

However, the inventors have noted that in certain situations, the capacitive electrodes with which the outer wall of the robot is equipped detect the electrical items located in the robot itself, in particular when the robot is a robotized arm comprising several articulated segments. Such a detection, hereinafter called "self-detection", limits the operational range of the robot. In fact, this self-detection can mask the presence of an object or a person approaching the robot and prevent the detection thereof, which is unacceptable from a safety point of view. It follows that in certain cases, the robot may put itself into degraded operating mode or freeze unnecessarily due to safety concerns.

A purpose of the present invention is to overcome this drawback.

Another purpose of the present invention is to propose a robot equipped with a more efficient detection functionality.

Another purpose of the present invention is to propose a robot equipped with a detection functionality avoiding self-detections.

Another purpose of the present invention is to propose a robot equipped with a detection functionality that does not limit the operational range of the robot and does not adversely affect the operation of the robot.

SUMMARY

At least one of these purposes is achieved with a robot comprising one or more sub-part(s), at least one of which, called fitted-out sub-part, comprising at least one electrical item placed in said sub-part, said robot also comprising:
- for at least one sub-part, called equipped, at least one capacitive detection electrode, called measurement electrode, placed on or in an outer wall of said sub-part, in particular electrically isolated from said outer wall when said outer wall is electrically conductive,
- at least one means of electrical polarization for polarizing said at least one measurement electrode at a first alternating electrical potential different from a general ground potential, at a frequency called working frequency, and
- at least one electronic unit, called detection unit, for measuring a signal relative to a coupling capacitance, called electrode-object capacitance, between at least one measurement electrode and a nearby object;

characterized in that, for at least one fitted-out sub-part the outer wall of which is at least partially non-electrically conductive, said at least one polarization means is also arranged in order to electrically guard at least one electrical item of said fitted-out sub-part, at an alternating electrical potential ($V_G$), called guard potential, identical or substantially identical to said first potential at said working frequency.

When an electrical item, referenced to an electrical potential, for example a general ground potential (MG) different from the guard potential, is located in a sub-part the outer wall of which is not electrically conductive, this item can be detected by the measurement electrodes with which the robot is equipped and cause a self-detection. The invention proposes to overcome this drawback by electrically guarding such an electrical item at the guard potential ($V_G$) such that it becomes electrically invisible to the capacitive detection electrodes with which the robot is equipped. As a result, such an item, guarded at the guard potential, will not be detected by the measurement electrodes as being a nearby object. The robot according to the invention is thus equipped with a more efficient detection functionality, which does not limit the operational range of the robot.

Electrically guarding an electrical item means making sure that for the nearby items, it appears to be globally polarized at the guard potential. As will be explained below, this can be carried out for example by the polarization or inclusion thereof in an enclosure polarized at the guard potential.

The fact of polarizing elements at the guard potential makes it possible to avoid the occurrence of leakage or stray capacitances between the capacitive detection electrodes and these items at the guard potential. Thus the presence of these guard elements makes it possible to optimize the range of the capacitive detection and to make it insensitive to its environment.

In the present application, two alternating potentials are identical at a given frequency when they each comprise an identical or similar alternating component at said frequency. Thus, the at least one of the two identical potentials at said frequency can also comprise a direct component, and/or an alternating component having a frequency different from said given frequency.

Similarly, two alternating potentials are different at the working frequency when they do not have an identical or similar alternating component at said working frequency.

In the present application, the term "ground potential" or "general ground potential" denotes a reference potential of the electronic unit, of the robot or of its environment, which can be for example an electrical earth or a ground potential. This ground potential can correspond to an earth potential or to another potential, connected or not connected to the earth potential.

Furthermore it is noted that generally, objects which are not in direct electrical contact with a particular electrical potential (electrically floating objects) tend to be polarized by capacitive coupling at the electrical potential of other objects present in their environment, such as for example earth or electrodes, if the surfaces of overlap between these objects and those of the environment (or the electrodes) are sufficiently large.

In the present application, "object" denotes any object or person that may be located in the environment of the robot.

In the robot according to the invention, at least one sub-part of said robot may not comprise a measuring electrode. In this case, this sub-part is called "non-equipped".

Alternatively, each sub-part of said robot can comprise at least one measurement electrode. In this case, this sub-part is called "equipped".

In the robot according to the invention, at least one sub-part can comprise at least one electrical item or element arranged in said sub-part. In this case, said sub-part is called "fitted-out". This electrical item or element is, in general, electrically referenced to an electrical potential corresponding for example to the reference potential of its electrical supply. This reference potential can be for example a ground potential, or, in certain embodiments of the invention, a guard potential.

Such an electrical item or element can be or comprise a motor, a sensor, an actuator, etc. For example, when the sub-part is an articulated interface, also called articulation, then said interface can comprise a motor. When the sub-part is a segment, said segment can comprise an electronic module or a sensor. When the sub-part is a functional head, said functional head can comprise a motor actuating a tool, a sensor, etc.

The outer wall of a sub-part can be formed by one or more trim elements.

The outer wall of a sub-part can be a casing, rigid or not rigid, of said sub-part.

Advantageously, at least one fitted-out sub-part, at least one electrical item of which is electrically guarded at the guard potential, can comprise a guard volume or walls:
  placed around said at least one electrical item, and
  polarized at the guard potential by at least one polarization means.

In other words, in this embodiment, the electrical item is guarded at the guard potential ($V_G$) by the guard volume (or walls), polarized at said guard potential.

Such a guard volume polarized at the guard potential makes it possible to render the electrical items of the sub-part invisible for the capacitive detection functionality.

Alternatively, or in addition, the robot according to the invention can comprise, for at least one fitted-out sub-part, at least one electrical item electrically polarized at, or referenced to, the guard potential by at least one polarization means, so as to be electrically guarded at the guard potential.

The robot according to the invention can then comprise at least one electrical converter arranged in order to:
  receive at least one electrical signal, called input signal, such as a supply or control signal, intended for said at least one electrical item, and reference said input signal to the guard potential; and/or
  receive at least one electrical signal, called output signal, transmitted by said at least one electrical item, and reference said output signal to the electrical ground potential of a controller, or a device, for which it is intended.

Thus, the electrical item located in the fitted-out sub-part is globally referenced to the guard potential and thus does not interfere with the capacitive detection.

This embodiment has the advantage of having a smaller space requirement, being cheaper and easier to install, compared with the use of a guard volume polarized at the guard potential.

The converter can be arranged to receive the input signals referenced to the general ground potential and to convert them at the output into signals referenced to the guard potential, and vice versa.

In the robot according to the invention, at least one fitted-out sub-part, at least one electrical item of which is guarded at the guard potential, may not be an equipped sub-part.

In other words, a sub-part of the robot comprising at least one electrical item guarded at the guard potential, may not comprise detection electrodes. Thus, even if this sub-part is not used for capacitive detection, the electrical items which are placed in said sub-part do not interfere with the capacitive detection.

Alternatively or in addition, at least one fitted-out sub-part, at least one electrical item of which is guarded at the guard potential, can be an equipped sub-part.

In other words, a sub-part of the robot, comprising at least one electrical item guarded at the guard potential, may also be equipped with detection electrodes and participate in the capacitive detection. In this case, as the items arranged in this sub-part are guarded at the guard potential, they do not interfere with the capacitive detection carried out by this sub-part but also by any other sub-part of the robot equipped with measurement electrodes.

Alternatively or in addition, an equipped sub-part may not be fitted-out, i.e. may not comprise an electrical item.

In addition, the robot according to the invention can comprise at least one sub-part the outer wall of which is at least partially electrically conductive.

Such a sub-part the outer wall of which is at least partially conductive may be fitted-out or not fitted-out.

Such a sub-part can be equipped, or not equipped, with measurement electrodes. In the case in which measurement electrodes are arranged on/in a conductive outer wall, said electrodes are isolated from said conductive outer wall.

In addition, according to an advantageous characteristic, at least one conductive part of the outer wall of a sub-part can be polarized at the guard potential by at least one polarization means.

In this case, said sub-part becomes electrically invisible to the measurement electrodes with which said sub-part or another sub-part is equipped, and more generally to the robot.

Alternatively or in addition, at least one sub-part, the outer wall of which is at least partially electrically conductive, can advantageously be equipped with measurement electrodes.

In this case, said conductive outer wall polarized at the guard potential forms a guard plane for said measurement electrodes.

In the present application, a sub-part of the robot can be or comprise for example any one of the following elements of which a robot may be composed:
  a robot segment,
  a mechanical interface, articulated or not articulated, placed between at least two robot segments,
  a functional head, articulated or not articulated, forming a tool, or a tool head, generally placed at the level of a distal end of the robot.

As previously explained, in the present application, by "electrical item" is meant any electrical item that can be placed in a sub-part of a robot, such as a motor, a sensor, an actuator, etc.

For example, when the sub-part is an articulated interface, also called articulation, then the electrical item can be a motor placed in the articulation. When the sub-part is a segment, the electrical item can be an electronic module, a controller or a sensor placed in said segment. When the sub-part is a functional head, the electrical item can be a motor actuating a tool, a sensor, etc.

The functional head can comprise, or can be formed by:
a means for gripping an object, such as a gripper or a vice;
a means for processing an object, such as a grinder, a drill, a paint gun, etc.; and/or
a means for inspecting an object, such as a camera, an interferometry head, etc.

According to a non-limitative embodiment, the robot according to the invention can comprise several segments.

At least one segment can be connected to another segment by an articulated mechanical interface, or not so connected.

In a particularly advantageous version, the robot according to the invention can comprise a functional head formed by a distal sub-part.

Such a functional head is generally located at a free end of the robot.

Advantageously, as the functional head is formed by, or forms, a sub-part, it can have each of the characteristics described above for a sub-part.

For example, it can comprise, or not comprise, at least one measurement electrode, in particular isolated from an outer wall of said functional head when said wall is conductive.

Alternatively or in addition, it can comprise, or not comprise, at least one electrical item placed in the functional head.

Alternatively or in addition, it can comprise an outer wall that is electrically at least partially non-conductive or conductive.

When the outer wall of the functional head is at least partially conductive, it can be set at the guard potential.

More generally, the whole of the functional head can be set at the guard potential in its entirety.

According to a version of the robot according to the invention, the functional head does not form a capacitive detection electrode. In other words, the functional head is not used as a capacitive detection electrode for detecting the presence or absence of a nearby object.

According to another version, the functional head can advantageously be used as, or form, a capacitive detection electrode. To this end, said functional head comprises an outer wall that is at least partially conductive.

In this version, the at least one polarization means is also arranged to polarize said functional head at the first alternating electrical potential, and the at least one electronic detection unit is arranged in order to measure a signal relating to a coupling capacitance between said functional head and a nearby object.

The robot according to the invention can optionally comprise:
at least one electrical insulator for electrically isolating said functional head from the rest of said robot, and/or
at least one guard, polarized at the guard potential, and placed between said functional head and the rest of said robot. in particular when the head is fastened on/in a sub-part the outer wall of which is electrically conductive;

In this version, the functional head is used as capacitive electrode to carry out a capacitive detection of approach or contact with a nearby object or person. The coupling capacitance generated by the functional head, and in particular by the tool or the tool holder of the robot according to the invention, and measured by the electronic detection unit, corresponds to the capacitance created between the environment and the functional head.

This version has the advantage of providing the head of a robot with a function of capacitive detection of approach or contact, without needing to equip said functional head with capacitive electrodes. Such a solution is simple, inexpensive, not very time-consuming and robust. In addition, such a solution can be applied, with few modifications, to an existing robot which was not initially designed with such a detection function.

Moreover, when provision is made for the robot to use interchangeable functional heads, the proposed solution makes it possible to operate on said functional heads independently, without operating on the rest of the robot.

Furthermore, a further advantage of this version is the possibility of using an on-board object of the functional head, such as the extension of the functional head used as electrode. In fact, close contact between the functional head and the transported object creates significant capacitive coupling between them. The functional head and the object that it transports are naturally at a similar electrical potential. The transported object has no need to be a good electrical conductor to act as the extension of the functional head with regard to capacitive detection. A dielectric of a plastic or polymer material the dielectric permittivity of which is for example greater than 3 is sufficient to become the extension of the functional head. The transported object then forms part of the sensitive functional head.

The functional head can comprise several separate sensitive parts used as separate capacitive electrodes, and polled sequentially or in parallel by the electronic detection unit. To the extent that the sensitive parts are polarized at the same first alternating electrical potential, they constitute respectively guard elements for the others and therefore do not cause mutual interference. These separate sensitive parts can be for example the fingers of a gripping tool.

In addition, the robot according to the invention can comprise at least one electrical item placed in the functional head, such as a sensor, an actuator, a motor, and/or an associated electronic unit (conditioner, driver). In this case, the functional head is called fitted-out.

Such an electrical item can comprise, or be combined with, electrical wires which carry input/output signals to/from said electrical item.

For example, the functional head can use, or be equipped with, a gripper. The latter is generally managed by the robot via two supply wires for the power and two serial communication wires for the controls and information return.

Now, by default, these electrical items are referenced to the general ground potential (MG) and therefore risk being detected by the sensitive part of the functional head used as capacitive electrode.

According to an embodiment, in particular in the case in which the functional head is used as a capacitive detection electrode, for at least one item placed in the functional head, said functional head can comprise a guard volume or walls, placed around said at least one electrical element and polarized at the guard potential, at the working frequency.

According to another embodiment, in particular in the case in which the functional head is used as a capacitive detection electrode, the robot according to the invention can comprise, in the functional head, at least one electrical item electrically polarized at, or referenced to, the guard potential by at least one polarization means, so as to be electrically guarded at the guard potential.

In this case, the robot according to the invention can also comprise at least one electrical converter arranged in order to:
receive at least one electrical signal, called input signal, such as a supply or control signal, intended for said at least one electrical element, and reference said input signal to the guard potential; and/or receive at least one electrical signal, called output signal, transmitted by said at least one electrical item, and reference said output signal to the electrical ground potential of a controller for which it is intended.

Thus, the electrical element located in the functional head is globally referenced to the guard potential and thus does not interfere with the capacitive detection.

This embodiment has the advantage of having a smaller space requirement, being cheaper and easier to install.

The converter can be arranged to receive the input signals referenced to the general ground potential and to convert them at the output into signals referenced to the guard potential, and vice versa.

The converter can be dedicated to the functional head.

Alternatively, the converter can be common to at least one other fitted-out sub-part for which a reference potential conversion functionality is implemented, as described above.

According to an embodiment, all of the electrical items arranged in the robot according to the invention can be electrically guarded at the guard potential ($V_G$), via a single, or several, converter(s), or via a single or several guard volumes.

According to embodiments, such a converter can comprise at least one of the following elements:
 at least one supply with galvanic isolation, such as a DC/DC converter, in particular for generating an input supply signal for said at least one electrical item;
 at least one electrical interface without galvanic contact, of the capacitive type or by opto-coupler, for at least one input control signal, or at least one output signal;
 one or more high-impedance inductors for receiving and transmitting at least one input signal or at least one output signal;
 at least one capacitor-commutated charge-transfer or charge-pump converter;
 diode devices.

It should be noted that to the extent that the detection of the capacitive coupling is carried out at a working frequency, the input/output electrical signals relating to the electrical items of the robot do not interfere with the measurement of the coupling capacitance as they are rejected or filtered by the electronic capacitive detection unit. This is even more efficient, in the case of a synchronous demodulation of the signal measured by the electronic detection unit.

The electrical polarization means can advantageously comprise an oscillator that generates an alternating excitation voltage used as first alternating electrical potential.

This alternating excitation voltage can also be used as guard potential ($V_G$).

The robot according to the invention can comprise a single polarization means.

Alternatively, the robot according to the invention can comprise a polarization means dedicated to a segment, an articulation or to the functional head.

The electronic detection unit can advantageously comprise a circuit comprising a current or charge amplifier. Such an amplifier can be produced by an operational amplifier and a counter-reaction capacitor.

According to preferential embodiments, the electronic detection unit, in particular the operational amplifier, can be supplied at a potential referenced to the guard potential.

According to other embodiments, the electronic detection unit can be supplied at a potential referenced to the general ground potential.

The electronic detection unit can also comprise a conditioner or conditioning means making it possible to obtain a signal representative of the sought electrode-object capacitance, and/or the presence or the proximity of an object.

This conditioner can comprise for example a synchronous demodulator for demodulating the signal with respect to a carrier, at a working frequency.

The conditioner can also comprise an asynchronous demodulator or an amplitude detector.

This conditioner can of course be produced in an analogue and/or digital form (microprocessor), and comprise all necessary means for filtering, conversion, processing etc.

The capacitive measurement signals, in particular the signals originating from the conditioner if applicable, can then be processed by software or a management module, which makes it possible to manage the detection of approach and touch, and in particular to exploit these items of information as a function of the context of use of the robot.

Such software, or calculation module, can for example be incorporated into a calculator or controller of the robot.

By way of example, the robot according to the invention can easily detect a human hand at a distance of more than 10 cm.

The robot according to the invention can comprise a single electronic detection unit.

Alternatively, the robot according to the invention can comprise an electronic detection unit dedicated to a sub-part, such as a segment, an articulation or the functional head.

According to embodiments, all of the electrical items arranged in the robot according to the invention can be electrically guarded at the guard potential.

The electronic detection unit and/or the polarization means can be partially or entirely placed in the body of the robot.

Alternatively, the electronic detection unit and/or the polarization means can be placed outside the robot and connected to said robot by one or more electrical connections.

According to non-limitative embodiments, the robot according to the invention can be or comprise any robotized system. It can in particular have the form of, or comprise, a robotized arm.

The robot can also be or comprise for example a mobile robot, a vehicle on wheels or tracks such as a fork lift equipped with an arm or a handling system, or a robot of the humanoid, gynoid or android type, optionally provided with movement items such as members.

The robot can thus comprise a guard provided using at least one part, or all, of the body of the robot according to the invention, polarized at the guard potential.

In fact, it is possible to polarize a significant part, or all, of the body of the robot at the guard potential. When the robot is a robotized arm, it is possible to polarize a significant part, or all, of the arm at the guard potential and to use it as a guard.

In this case, a converter electronic circuit, called interface circuit, is interfaced between the electrical circuit of this guard-polarized part of the robot, and the electrical circuit of the rest of the robot referenced to the general ground. This interface circuit generates excitation of the capacitive electronic unit referenced to the guard, and provides the interface between the electronic unit of the part polarized at the guard of the robot and the electronic unit referenced to ground (supply, communication, etc.) of the rest of the robot. This interface circuit can be housed at the level of the part referenced to the guard of the robot, or at the level of the part referenced to the ground potential of the robot.

When part or all of the robot is covered with capacitive electrodes, and the part of the robot supporting these electrodes is referenced to the guard potential, the structure of the robot at the level of this part can thereby be simplified, as it is not necessary to insert an additional guard between the robot and these capacitive electrodes. These electrodes and the functional head can then be referenced to the same guard potential, which avoids any interference.

BRIEF DESCRIPTION OF THE DRAWINGS

Other advantages and characteristics will become apparent on reading the detailed description of non-limitative examples and from the attached drawings in which.

DETAILED DESCRIPTION

It is well understood that the embodiments that will be described hereinafter are in no way limitative. In particular, variants of the invention may be envisaged comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

Figure 1:
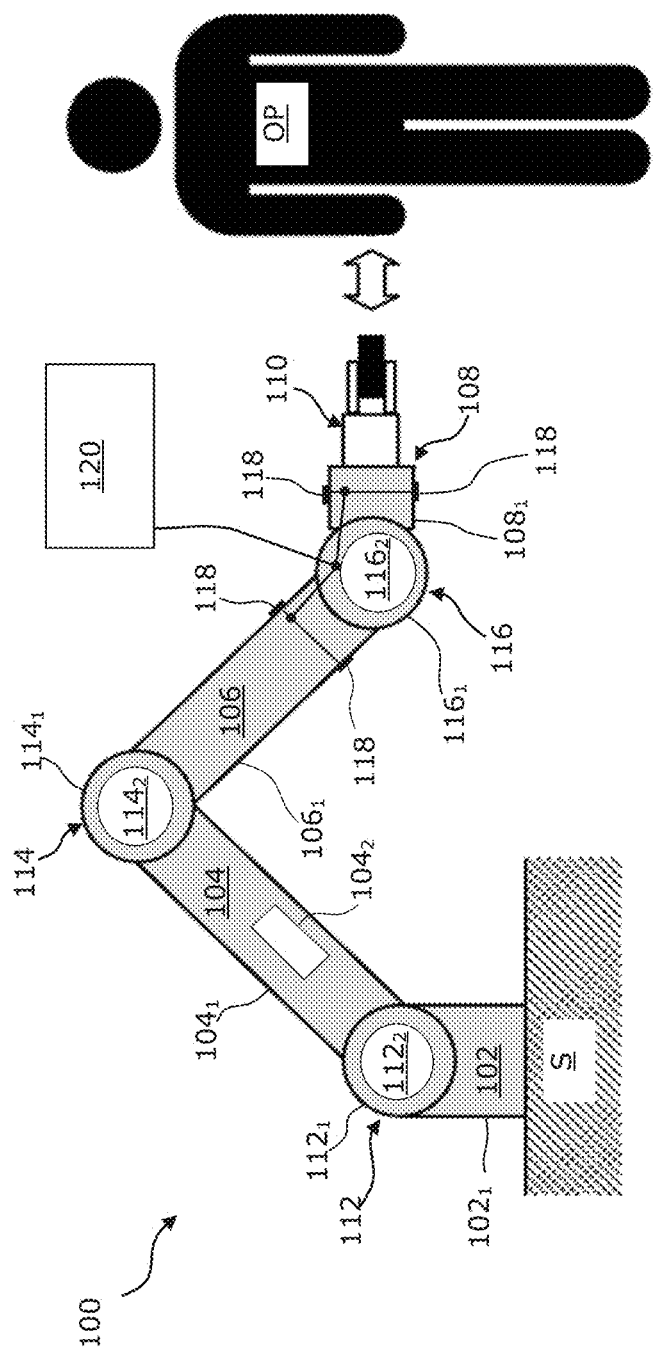
FIG. 1 is a diagrammatic representation of an example robot of the prior art equipped with capacitive detection electrodes.

FIG. 1 is a diagrammatic representation of an embodiment of a robot of the prior art equipped with capacitive detection electrodes.

The robotized arm 100 can be, for example, an industrial collaborative robot working under the supervision of, or in collaboration with, an operator OP, or also a medical robot in the case of a surgical operation on the body of a person, or also a personal assistance robot.

The robot 100, shown in FIG. 1, is presented in the form of an articulated robotized arm comprising eight sub-parts 102-116, namely:

four segments 102, 104, 106 and 108;
a functional head 110; and
three mechanical interfaces 112, 114 and 116.

Segment 102 is the base segment fastened to a support S, which can be the ground. The segment 108 is the segment located on the side of a free end of the robot 100. Each segment 102-108 is delimited by an outer wall or casing, respectively $102_1$-$108_1$, produced by the surface of an element of the structure of the segment, or by one or more cover elements, for example made from plastic material (polymer) or metal(s). Generally, each segment 102-108 is hollow and enables electrical or electronic items to be placed in said segment.

The functional head 110 is located on the side of the segment 108, and forms a tool or a tool-holder, which in the example shown is a gripper.

Segments 102-108 are articulated by means of the articulated mechanical interfaces 112-116, also called "articulations" hereinafter. Articulation 112 is located between segments 102 and 104, articulation 114 is located between segments 104 and 106, and articulation 116 is located between segments 106 and 108. Each segment 112-116 comprises an outer wall or casing, respectively $112_1$-$116_1$, produced from one or more cover elements, for example made from plastic material (polymer) or metal(s).

Each of the articulations 112-116 is an articulation rotating about an axis. Alternatively, at least 112-116 can, additionally or instead, be a translational articulation, and/or a rotational articulation with several axes.

The articulated segments 106 and 108 are equipped with one or more capacitive detection electrodes 118, called measurement electrodes. Each measurement electrode 118 with which the segment 106 is equipped, respectively the segment 108, is electrically isolated from the outer wall $106_1$, respectively $108_1$, of this segment.

An electronic module 120 is associated with the robot 100. This electronic module 120 comprises:

an electronic polarization unit polarizing each measurement electrode 118 at a first alternating potential, different from a general ground potential (MG), at a non-zero working frequency; and an electronic measurement unit for measuring an electrical signal, in particular an electric current, for each of the measurement electrodes 118 in order to deduce therefrom a capacitance, called electrode-object capacitance, resulting from a capacitive coupling between the measurement electrode and an object in its vicinity electrically polarized at the ground potential (MG) or at least at a potential different from the first alternating potential, and representative of a distance between said measurement electrode 118 and a nearby object.

An example of module 120 will be described below with reference to FIG. 12.

Each measurement electrode 118 is also preferably guarded by an electrode, called guard electrode (not shown) polarized by an alternating guard potential, denoted $V_G$, identical or substantially identical to the first potential at the working frequency, and placed along the rear face of the electrode, for example between the wall of the segment and the measurement electrode 118.

Thus, the robot 100 can detect an object located in its environment by means of the measurement electrodes 118.

In the example shown, each articulation 112-116 comprises a motor, respectively $112_2$-$116_2$. When one of the articulations 112-114 comprises an outer casing $112_1$-$116_1$ that is electrically non-conductive, in certain configurations, the measurement electrodes 118 also detect the motor $112_2$-$114_2$ located in this articulation. In fact, as each electric motor $112_2$-$114_2$ is referenced to a general ground potential (MG), thus it is detected as being an external object, similarly to the operator OP. For example, when one of the equipped segments 106 or 108, come close to the articulation 112, respectively 114 or 116, then the measurement electrodes 118 equipping this segment detect the motor $112_2$, respectively $114_2$ or $116_2$, located in this articulation as being a nearby object, when this is not the case.

In addition, in the example shown, segment 104 comprises an electronic module $104_2$ referenced to a general ground potential (MG). If the segment 104 comprises an outer casing $104_1$ that is electrically non-conductive, in certain configurations, the measurement electrodes 118 also detect the electronic module $104_2$ located in this segment 104. In fact, as the electronic module $104_2$ is referenced to a general ground potential (MG), thus it is detected as being an external object, similarly to the operator OP. For example, when one of the equipped segments 106 or 108 comes close to the segment 104, then the measurement electrodes 118 equipping this segment detect the electronic module $104_2$ located in this segment 104 as being a nearby object, when this is not the case.

These self-detections reduce the operational range of the robot 100 and detract from its functionality.

In order to overcome these drawbacks, the invention proposes to guard at an alternating guard potential $V_G$ identical, or substantially identical, to the first potential at the working frequency, at least one electrical item located in a sub-part of the robot, the external casing of which is not electrically conductive.

Figure 2:
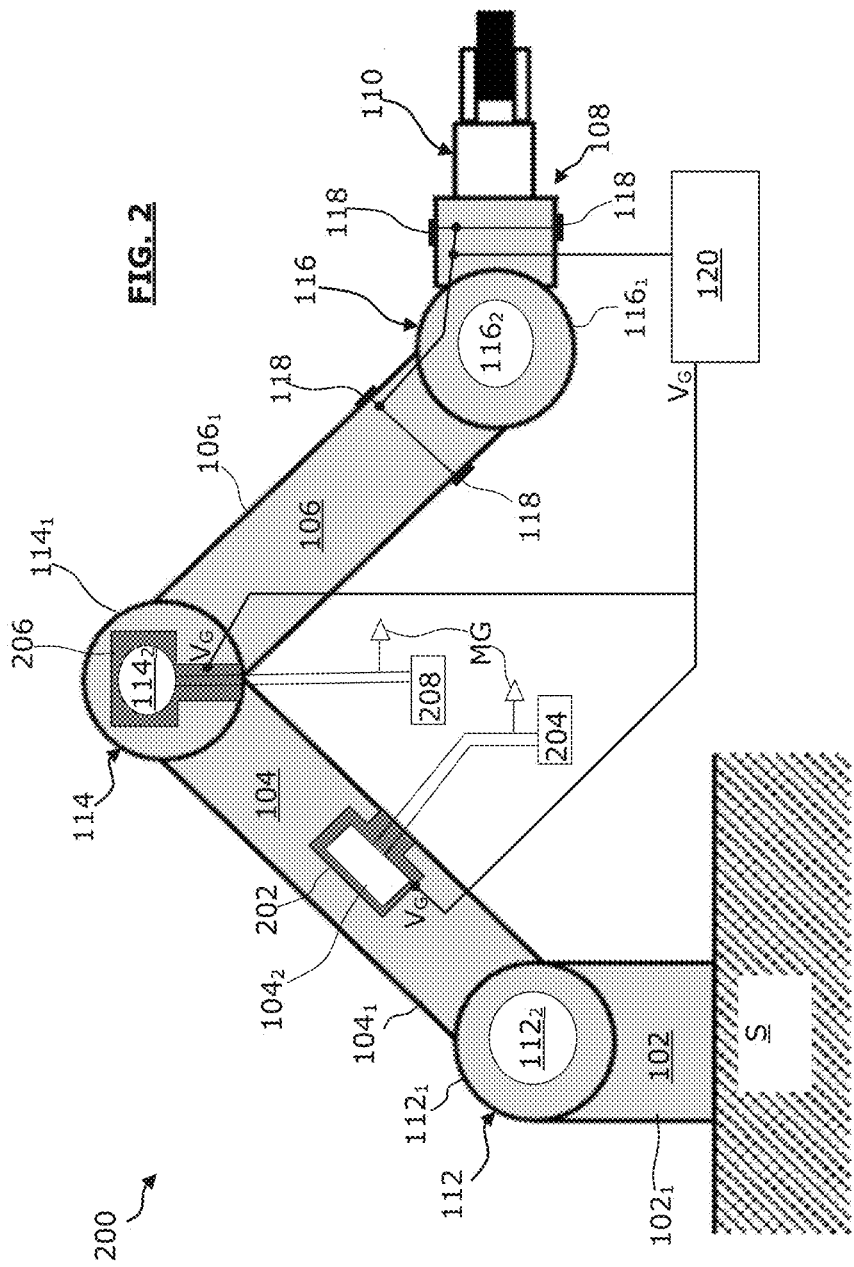
FIGS. 2-5 are diagrammatic representations of different embodiments of a robot according to the invention.

FIG. 2 is a diagrammatic representation of a non-limitative embodiment of a robot according to the invention.

The robot 200, shown in FIG. 2, comprises all the elements of the robot 100 in FIG. 1.

In the example shown in FIG. 2, it is assumed that the casing $104_1$ of the segment 104 is electrically non-conductive. Similarly, it is assumed that the casing $114_1$ of the articulation 114 is electrically non-conductive.

In the robot 200, the electrical module $104_2$, referenced to a general electrical ground potential MG, as well as its electrical connectors are placed in a guard volume 202, polarized at a guard potential $V_G$ identical, or substantially identical, to the first alternating potential at the working frequency. Thus, the electronic module 1042 and the connectors that are associated therewith, are not visible to the measurement electrodes 118 and do not interfere with the capacitive detection carried out by said measurement electrodes 118 while continuing to receive/transmit, electrical signals referenced to the general ground potential MG from/to a controller, or a device, 204.

Similarly, in the robot 200, the electric motor $114_2$, referenced to a general electrical ground potential MG, as well as its electrical connectors and its electronic unit, are placed in a guard volume 206, polarized at a guard potential $V_G$ identical, or substantially identical, to the first alternating potential at the working frequency. Thus, the electric motor $114_2$, its connectors and its electronic unit are not visible to the measurement electrodes 118 and do not interfere with the capacitive detection carried out by said measurement electrodes 118 while continuing to receive/transmit, electrical signals referenced to the general ground potential MG from/to a controller 208.

As for the motor $114_2$, it is also possible to place the electric motor $112_2$, respectively $116_2$ (as well as its electrical connectors and electronic unit) in a guard volume arranged in the articulation 112, respectively 116, if the casing $112_1$, respectively $116_1$, of this articulation is electrically non-conductive, or insulating.

In general, all of the items, placed in the robot 200, can be arranged in a guard volume polarized at the guard potential, in particular when these items are arranged in a sub-part the casing of which is not electrically conductive.

The guard volumes are made for example from a set of conductive walls polarized at the guard potential $V_G$ and surrounding respectively the electric motors or the electrical modules.

Figure 3:
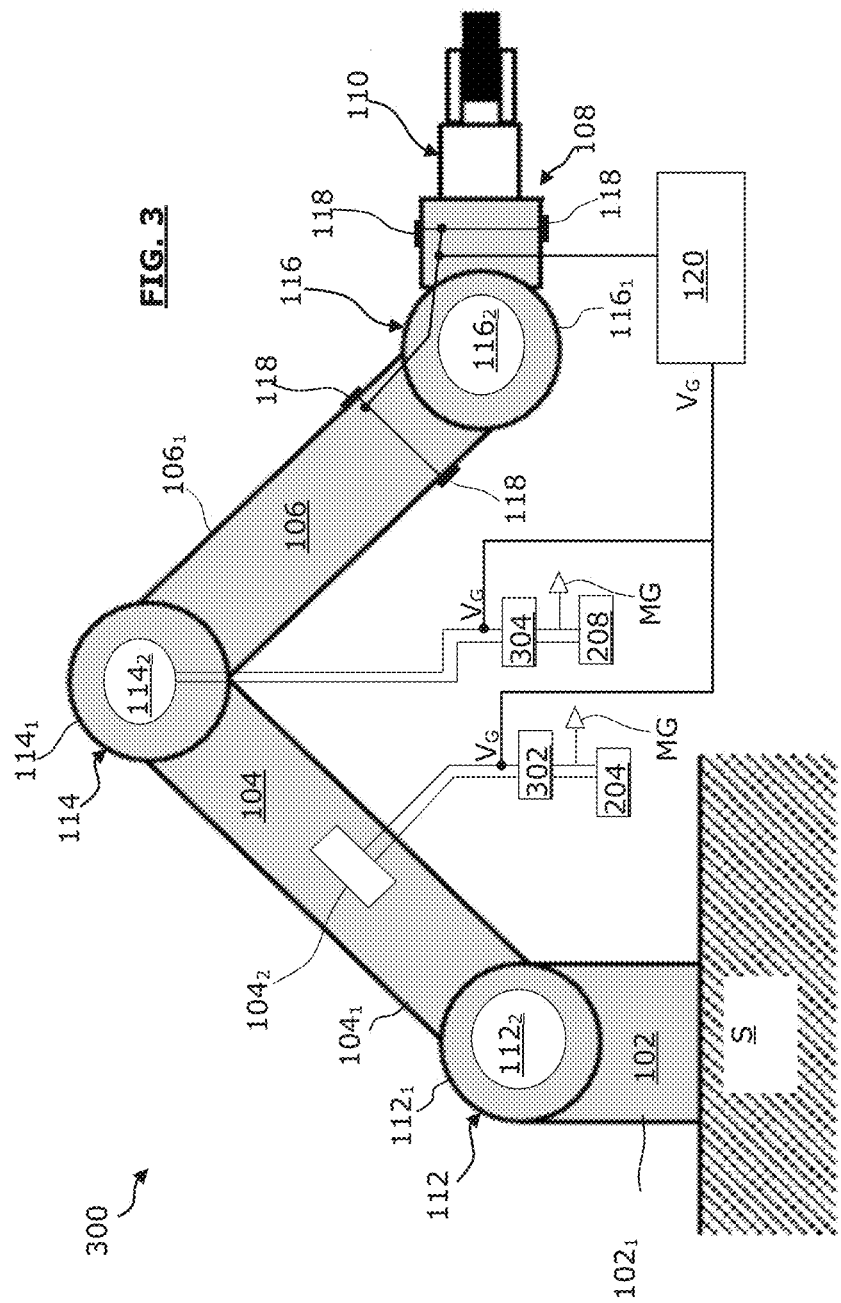

FIG. 3 is a diagrammatic representation of a non-limitative embodiment of the robot according to the invention.

The robot 300, shown in FIG. 3, comprises all the elements of the robot 100 in FIG. 1.

In the example shown in FIG. 3, it is assumed that the casing $104_1$ of the segment 104 is electrically non-conductive, or insulating. Similarly, it is assumed that the casing $114_1$ of the articulation 114 is electrically non-conductive, or insulating.

In the robot 300, instead of the guard volume 202 in FIG. 2, a potential converter 302 is used. This converter 302 is placed between the controller 204 and the electronic module $104_2$. The function of this converter 302 is to:
  receive at least one electrical signal, called input signal, such as a supply or control signal, transmitted by the controller 204 and intended for the module $104_2$, and reference said input signal to the guard potential ($V_G$); and
  receive at least one electrical signal, called output signal, transmitted by said module $104_2$, and intended for said controller 204 and reference said output signal to the general ground potential MG of the controller 204.

Thus the electronic module $104_2$, as well as the connectors that are associated therewith, receive and transmit signals referenced to the guard potential $V_G$ and do not interfere with the detection electrodes of the robot 300.

Similarly, instead of the guard volume 206 in FIG. 2, a potential converter 304 is used. This converter 304 is placed between the controller 208 and the electric motor $114_2$. The function of this converter 304 is to:
  receive at least one electrical signal, called input signal, such as a supply or control signal, transmitted by the controller 208 and intended for said electric motor $114_2$, and reference said input signal to the guard potential ($V_G$); and
  receive at least one electrical signal, called output signal, transmitted by said electric motor $114_2$, and intended for said controller 208 and reference said output signal to the general ground potential MG of the controller 208.

Thus the electric motor 1142, as well as the connectors and the electronic unit that are associated therewith, receive and transmit signals referenced to the guard potential $V_G$ and do not interfere with the detection electrodes of the robot 300.

As for the motor $114_2$, it is also possible to use a potential converter for the electric motor $112_2$, respectively $116_2$ (as well as its electrical connectors and electronic unit) if the casing $112_1$, respectively $116_1$, of this articulation is insulating.

In general, all of the items, arranged in the robot 300, can be associated with a potential converter, in particular when these items are arranged in a sub-part the casing of which is not electrically conductive.

In the example in FIG. 3, two independent potential converters are used. Of course, it is possible to use a single potential converter that is common to several, or even to all of the items arranged in the robot 300.

In addition, it is possible to combine the embodiments in FIGS. 2 and 3. For example, it is possible to place an electrical item in a guard volume and to supply another electrical item via a potential converter.

Figure 4:
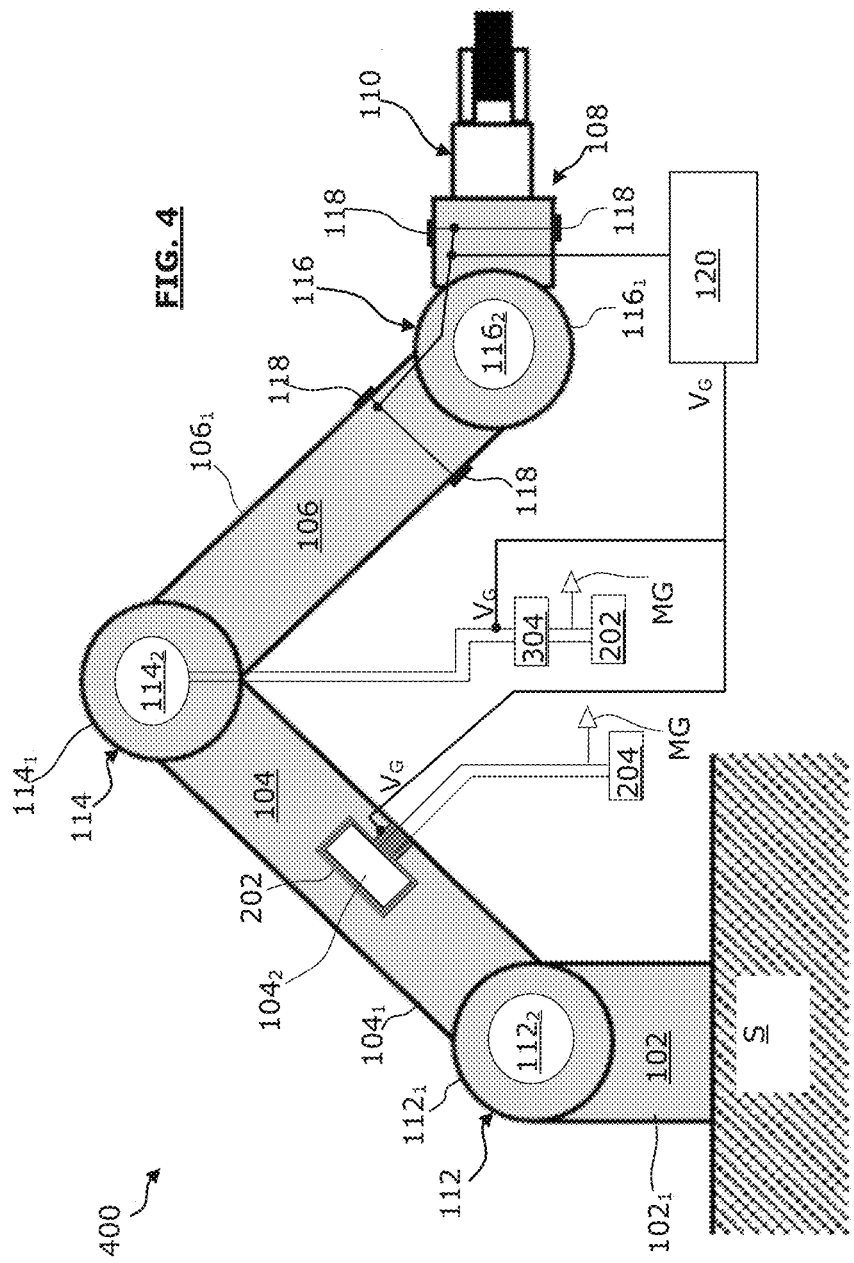

FIG. 4 is a diagrammatic representation of such an embodiment.

In the robot 400 in FIG. 4, the electronic module $104_2$ is placed in the guard volume 202 as in FIG. 2. In addition, the signals are exchanged with the electric motor $114_2$ via the potential converter 304, as in FIG. 3, without using a guard volume for the motor $114_2$.

In the examples in FIGS. 2-4, the segment 106, respectively 108, equipped with measurement electrodes 118 does not comprise any item.

Of course, this segment 106, respectively 108, can also comprise at least one electrical item. In this case, and if the casing $106_1$, respectively $108_1$, of this segment is not electrically conductive, then the electrical item placed in the segment 106, respectively 108, can either be arranged in a guard volume, or associated with a potential converter, as described above.

In addition, in the examples in FIGS. 2-4, the segment 104, and the articulation 114 are not equipped with measurement electrodes. Of course, this segment 104 and/or this articulation 116 can also be equipped with measurement electrodes.

In general, when a sub-part of a robot comprises an outer wall that is not electrically conductive and this sub-part comprises an electrical item, it is possible:
to place said item in a guard volume, or
to use a potential converter for this electrical item.

Such a sub-part can be equipped, or not equipped, with measurement electrodes.

Such a sub-part can be a segment, an articulation, or a functional head having the form of a tool or of a tool-holder.

Moreover, it is possible for a robot to be constituted by several sub-parts, some of which comprise an outer wall that is not electrically conductive and another comprising an outer wall that is at least partially electrically conductive.

Now, the electrically conductive outer wall of a robot is detected by measurement electrodes, if this wall is not at the guard potential $V_G$ at the working frequency.

Such a self-detection reduces the operational range of the robot and detracts from its functionality.

The invention also makes it possible to overcome this drawback.

Figure 5:
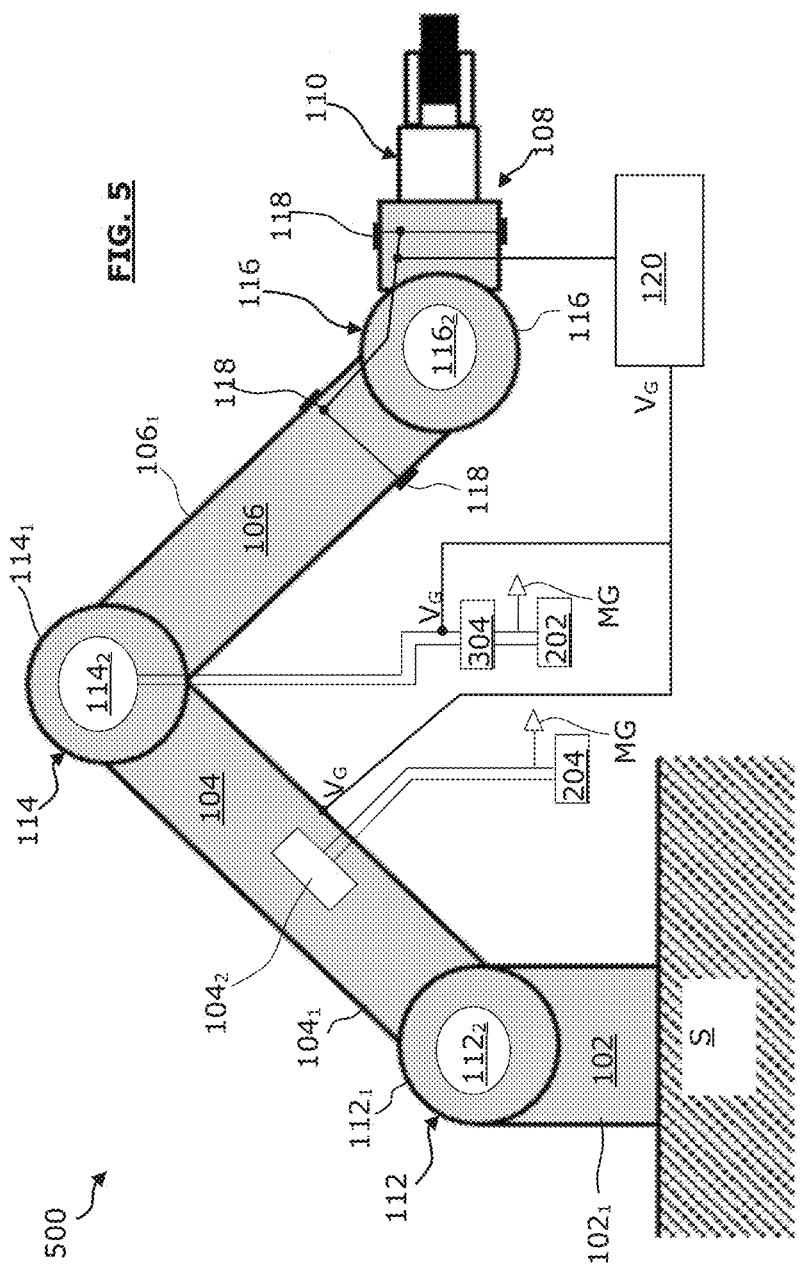

FIG. 5 is a diagrammatic representation of another non-limitative embodiment of a robot according to the invention.

The robot 500, shown in FIG. 5, comprises all the elements of the robot 100 in FIG. 1.

In the example shown in FIG. 5, it is assumed that the casing $104_1$ of the segment 104 is electrically conductive. It is assumed, moreover, that the casing $114_1$ of the articulation 114 is electrically non-conductive.

Under these conditions, in order to avoid the measurement electrodes 118 detecting the electric motor 1142, the robot 500 utilizes the potential converter 304 as described with reference to FIG. 4, for example.

In addition, in order to avoid the measurement electrodes 118 detecting the electrically conductive casing $104_1$ of the segment 104, said casing $104_1$ is polarized at the guard potential $V_G$. Thus, the casing $104_1$, and as a result the segment 104, become electrically invisible to the measurement electrodes 118.

In general, when a sub-part of a robot comprises an electrically conductive outer wall, then it is possible to polarize said outer wall at the guard potential $V_G$ so that said conductive casing is not detected by the measurement electrodes.

Such a sub-part can be a sub-part comprising, or not comprising, an electrical item.

Such a sub-part can be equipped, or not equipped, with measurement electrodes. If the measurement electrodes are on a conductive outer wall polarized at the guard potential $V_G$, it is not necessary to insert a guard plane under these measurement electrodes.

Such a sub-part can be a segment, an articulation, or a functional head having the form of a tool or of a tool-holder.

Examples of a functional head that can be utilized in the robot according to the invention, in particular in combination with any one of the above-described robots 200, 300, 400 and 500 will now be described.

Figure 6:
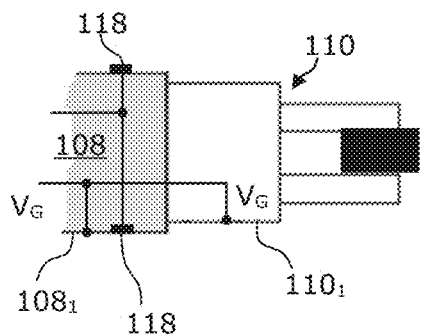
FIGS. 6-11 are partial diagrammatic representations of different examples of a functional head with which a robot according to the invention can be equipped.

FIG. 6 is a diagrammatic representation of an example of a functional head that can be utilized in a robot according to the invention, in particular in any one of the robots in FIGS. 2-5.

In the example shown in FIG. 6, the outer wall $108_1$ of the segment 108 on which the functional head 110 is fastened is electrically conductive and polarized at the guard potential $V_G$.

In addition, the functional head, or the outer wall $110_1$ of the functional head 110, is also electrically conductive and set at the guard potential $V_G$.

Thus, the functional head 110 is electrically invisible to the measurement electrodes 118 with which the segments 106 and 108 are equipped. In this configuration, there is thus no risk of the measurement electrodes 118 detecting the functional head.

According to an alternative version, the outer wall $108_1$ of the segment 108 may not be electrically conductive and may not be set at the guard potential $V_G$.

Figure 7:
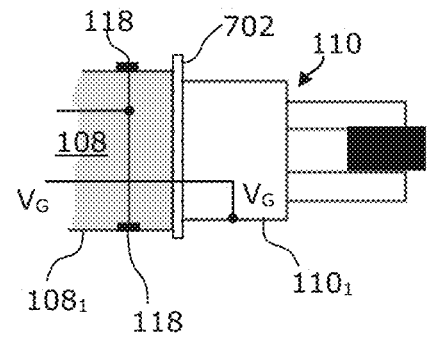

FIG. 7 is a diagrammatic representation of another example of a functional head that can be utilized in a robot according to the invention, in particular in any one of the robots in FIGS. 2-5.

In the example shown in FIG. 6, the outer wall $108_1$ of the segment 108 on which the functional head 110 is fastened, is not polarized at the guard potential $V_G$.

At the same time, the functional head 110, or the outer wall $110_1$ of the functional head 110, is polarized at the guard potential $V_G$. In addition, an electrical insulator 702 is inserted between the segment 108 and the functional head 110 so that the functional head 110 is electrically isolated from the segment 108.

Under these conditions, the functional head 110 is electrically invisible to the measurement electrodes 118 with which the segments 106 and 108 are equipped. In this configuration, there is thus no risk of the measurement electrodes 118 detecting the functional head.

According to an alternative version, when the outer wall $108_1$ of the segment 108 is not conductive, it is not necessary to use the insulator 702.

Figure 8:
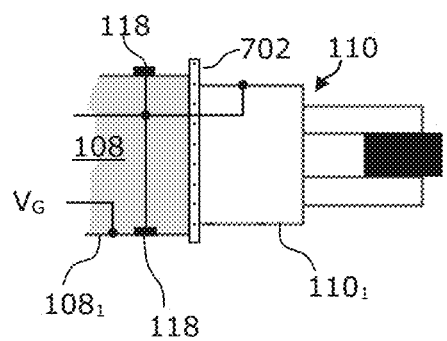

FIG. 8 is a diagrammatic representation of another example of a functional head that can be utilized in a robot according to the invention, in particular in any one of the robots in FIGS. 2-5.

In the example shown in FIG. 8, the outer wall $108_1$ of the segment 108 on which the functional head 110 is fastened, is polarized at the guard potential $V_G$.

The functional head 110 is electrically isolated from the segment 108 by the electrical insulator 702.

In addition, the functional head 110 is polarized at the first alternating potential, like the measurement electrodes 118, so as to form a capacitive detection electrode. As the wall $108_1$ of the segment 108 is at the guard potential $V_G$, the detection electrode formed by the functional head 110 is electrically guarded by said outer wall 108: of the segment 108.

Under these conditions, the functional head 110 is used as a capacitive detection electrode for detecting objects or the person 102 that are present in a detection zone around the functional head 110.

The module 120 makes it possible to measure an electrical signal, in particular an electric current, relating to a coupling capacitance, called electrode-object capacitance, denoted $C_{eo}$, between the functional head 110 and its environment.

According to an alternative version, the outer wall $108_1$ of the segment 108 may be conductive and not be polarized at the guard potential $V_G$.

According to yet another an alternative, the outer wall $108_1$ of the segment 108 may not be electrically conductive and may not be set at the guard potential $V_G$. In this case, it is not necessary to use the insulator 702.

Figure 9:
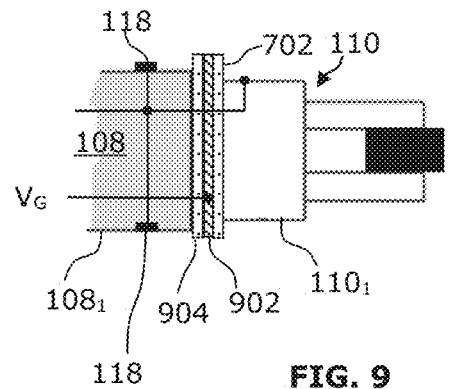

FIG. 9 is a diagrammatic representation of another example of a functional head that can be utilized in a robot according to the invention, in particular in any one of the robots in FIGS. 2-5.

In the example shown in FIG. 9, the outer wall $108_1$ of the segment 108 on which the functional head 110 is fastened, is not polarized at the guard potential $V_G$.

The functional head 110 is polarized at the first alternating potential, like the measurement electrodes 118.

In addition, a guard element 902, polarized at the guard potential $V_G$, is placed between the functional head 110 and the segment 108. This guard element 902 makes it possible to electrically guard the functional head 110 used as capacitive detection electrode.

The guard element 902 is electrically isolated from the functional head 110 by the electrical insulator 702 and from the segment 108 by an electrical insulator 904.

Under these conditions, the functional head 110 is used as a capacitive detection electrode guarded by the guard element 902 for detecting objects or the person 102 that are present in a detection zone around the functional head 110.

The guard element 902 can be produced from any electrically conductive element, such as for example a piece of sheet metal. The guard element 902 can be plane, or can have the form of a sleeve covering a part of the segment 108 or of the functional head 110.

According to yet another alternative, the outer wall $108_1$ of the segment 108 may not be conductive. In this case, it is not necessary to use the insulators 702 and 904, or the guard 902.

In the examples in FIGS. 8 and 9, the functional head is polarized at the first electrical potential and is used as a capacitive detection electrode.

However, in certain configurations, the functional head can comprise an electrical item, such as a motor, a sensor, etc. receiving an input signal and/or transmitting an output signal. In this configuration, such an electrical item interferes with the capacitive detection carried out by the functional head.

Examples will now be described which allow this drawback to be overcome.

Figure 10:
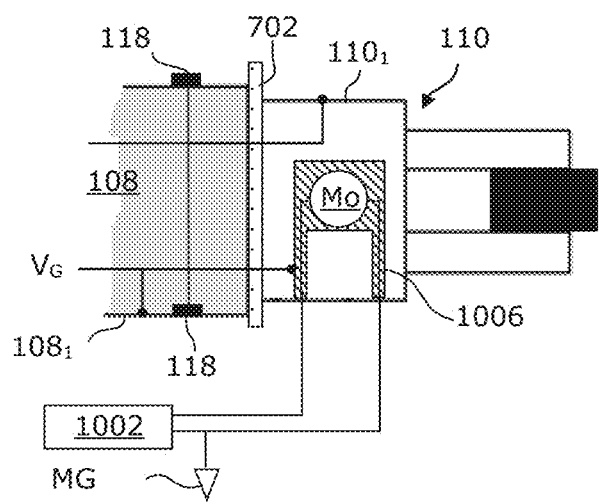

FIG. 10 is a diagrammatic representation of another example of a functional head that can be utilized in a robot according to the invention, in particular in any one of the robots in FIGS. 2-5.

In the example shown in FIG. 10, the functional head 110 comprises all the elements of the functional head in FIG. 8.

In addition, the functional head 110 comprises an electrical item, which in the present example is a motor Mo making it possible to move the grippers of the functional head 110.

The electric motor Mo receives a supply signal from, and optionally transmits an output signal making it possible to determine the position of the grippers to, a controller 1002 which can be a robot controller. Generally, these input/output signals are referenced to an electrical ground potential MG. Now, when the functional head 110 is used as capacitive detection electrode, then the motor Mo as well as the electrical lines conducting the input/output signals, referenced to the general ground potential MG, interfere with the detection carried out by the functional head 110.

In order to avoid this interference, the motor Mo, as well as the connectors and electronic unit associated therewith, are placed in a guard volume 1006 polarized at the guard potential $V_G$. Thus, the electric motor Mo and the connectors and electronic unit associated therewith, are not visible to the functional head 110 and do not interfere with the capacitive detection carried out by said functional head 110.

Of course, such a guard volume can also be used in combination with the embodiment in FIG. 9.

Figure 11:
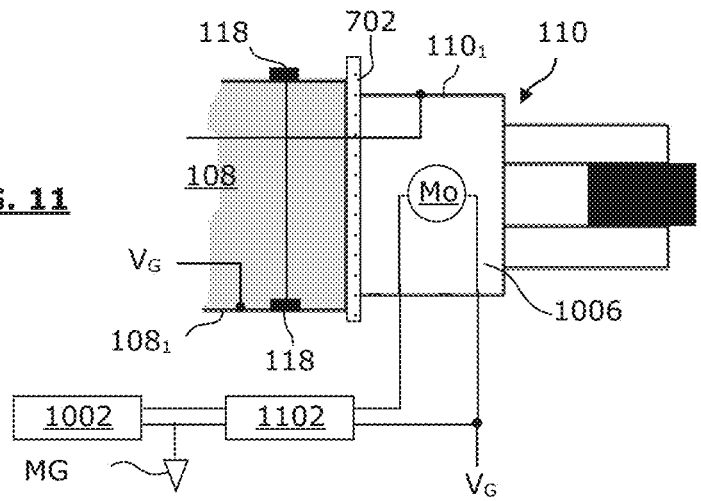

FIG. 11 is a diagrammatic representation of another example of a functional head that can be utilized in a robot according to the invention, in particular in any one of the robots in FIGS. 2-5.

In the example shown in FIG. 10, the functional head 100 comprises all the elements of the functional head in FIG. 10, with the exception of the guard volume 1006.

Instead of the guard volume, a potential converter 1102 is used. This converter 1102 is placed between the controller 1002 and the electric motor Mo. The function of this converter 1102 is to:

receive at least one electrical signal, called input signal, such as a supply or control signal, transmitted by the controller 1002 and intended for the electric motor Mo, and reference said input signal to the guard potential ($V_G$); and receive at least one electrical signal, called output signal, transmitted by said electric motor Mo and intended for the controller 1002, and reference said output signal to the electrical ground potential MG of the controller.

Thus the electric motor Mo, as well as the connectors and the electronic unit associated therewith, are supplied by signals referenced to the guard potential $V_G$ and do not interfere with the capacitive detection electrode that constitutes the functional head 106.

Of course, such a guard volume can also be used in combination with the embodiment in FIG. 9.

The potential converter 1102 can be the potential converter 302 or 304 in FIG. 3 or 4.

Figure 12:
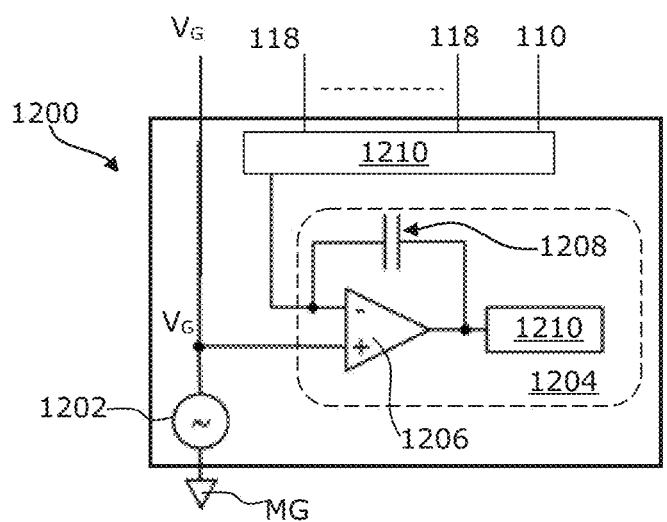
FIG. 12 is a diagrammatic representation of an embodiment of an electronic detection unit that can be utilized in a robot according to the invention.

FIG. 12 is a diagrammatic representation of an electronic detection unit that can be utilized in a robot according to the invention, in particular in any one of the robots in FIGS. 2-5.

The electronic module 1200, shown in FIG. 12, can be the electronic module 120 in FIGS. 2-5.

The electronic module 1200 comprises an oscillator 1202 that generates an alternating excitation voltage, denoted $V_G$, used as guard potential.

The electronic module 1200 also comprises an electronic detection unit 1204 composed of a current or charge amplifier, represented by an operational amplifier 1206 and a counter-reaction capacitor 1208.

The electronic detection unit 1204 also comprises a conditioner 1210 making it possible to obtain a signal representative of the sought coupling capacitance $C_{eo}$, and/or of the presence or the proximity of an object, a body. This conditioner 1210 can comprise for example a synchronous demodulator for demodulating the signal with respect to a carrier, at a working frequency. The conditioner 1210 can also comprise an asynchronous demodulator or an amplitude detector. This conditioner 1210 can of course be produced in an analogue and/or digital form (microprocessor), and comprise all necessary means for filtering, conversion, processing etc.

The electronic module 1200 can comprise an electronic detection unit 1204 dedicated to each of the detection electrodes 118 and to the functional head 110.

Alternatively, and as shown in FIG. 12, the electronic module 1200 can comprise a single electronic detection unit 1204 and a polling means 1210 connecting said electronic detection unit 1204 in turn with each measurement electrode 118 and with the functional head 110, so as to poll individually each of said measurement electrodes and the functional head 110.

Of course, the electronic module 1200 can comprise components other than those described.

In addition, the electronic module 1200 can be at least partially incorporated into an electronic unit of the robot, or into the body of the robot, or into the functional head, or also into an existing or additional interface, positioned between the functional head and the body of the robot.

The electronic module 1200 can also be presented in the form of a module or a housing external to the body of the robot. In this case, all or part of the electrical connections described can be located in the electronic module 1200, connected to the other elements with cables.

Of course, the invention is not limited to the examples which have just been described and numerous adjustments can be made to these examples without exceeding the scope of the invention.

The invention claimed is:

1. A robot comprising one or more sub-part(s), at least one of which, called fitted-out sub-part, comprising at least one electrical item placed in said sub-part, said robot also comprising:
    for at least one sub-part, called equipped, at least one capacitive detection electrode, called measurement electrode, placed on, or in, an outer wall of said sub-part,
    at least one means of electrical polarization for polarizing said at least one measurement electrode at a first alternating electrical potential different from a general ground potential (MG), at a frequency, called working frequency, and
    at least one electronic unit, called detection unit, for measuring a signal relative to a coupling capacitance, called electrode-object capacitance, between the at least one measurement electrode and a nearby object (OP);
characterized in that, for at least one fitted-out sub-part the outer wall of which is at least partially non-electrically conductive, said at least one polarization means is also arranged in order to electrically guard at least one electrical item of said fitted-out sub-part at an alternating electrical potential ($V_G$), called guard potential, identical or substantially identical to said first potential, at said working frequency.

2. The robot according to claim 1, characterized in that at least one fitted-out sub-part, at least one electrical item of which is electrically guarded at the guard potential ($V_G$) comprises a guard volume or walls:
    placed around said at least one electrical item, and
    polarized at the guard potential ($V_G$) by the at least one polarization means.

3. The robot according to claim 1, characterized in that it comprises, in at least one fitted-out sub-part, at least one electrical item electrically polarized at, or referenced to, the guard potential (VG) by the at least one polarization means, so as to be electrically guarded at the guard potential (VG).

4. The robot according to claim 3, characterized in that it comprises, for at least one electrical item (Mo) at least one electrical converter arranged to:
    receive at least one electrical signal, called input signal, such as a supply or control signal, intended for said at least one electrical element (Mo), and reference said input signal to the guard potential ($V_G$); and/or
    receive at least one electrical signal, called output signal, transmitted by said at least one electrical item (Mo), and reference said output signal to the electrical ground potential (MG) of a controller for which it is intended.

5. The robot according to claim 4, characterized in that the electrical converter comprises:
    at least one supply with galvanic isolation, such as a DC/DC converter, in particular for generating a supply input signal for said at least one electrical item (Mo);
    at least one electrical interface without galvanic contact, of the capacitive type or by opto-coupler, for at least one input control signal, or at least one output signal;
    one or more high-impedance inductors for receiving and transmitting at least one input signal or at least one output signal; and/or
    at least one capacitor-commutated charge-transfer or charge-pump converter.

6. The robot according to claim 1, characterized in that at least one fitted-out sub-part, at least one item of which is guarded at the guard potential ($V_G$), is not an equipped sub-part.

7. The robot according to claim 1, characterized in that at least one fitted-out sub-part, at least one item of which is guarded at the guard potential, is an equipped sub-part.

8. The robot according to claim 1, characterized in that it comprises at least one sub-part, the outer wall of which is at least partially electrically conductive.

9. The robot according to claim 8, characterized in that at least one conductive part of the outer wall of a sub-part is polarized at the guard potential ($V_G$) by at least one polarization means.

10. The robot according to claim 8, characterized in that it comprises at least one sub-part, the outer wall of which is at least partially electrically conductive, is equipped with measurement electrodes.

11. The robot according to claim 1, characterized in that at least one sub-part of said robot is:
    a segment of said robot, or
    a mechanical interface, articulated or not articulated, between at least two segments of said robot, or
    a functional head, articulated or not articulated, forming a tool, or a tool head.

12. The robot according to claim 1, characterized in that it comprises a functional head formed by a sub-part, said functional head forming a capacitive detection electrode, the at least one polarization means also being arranged to polarize said functional head at the first alternating electrical potential, and the at least one electronic detection unit being arranged in order to measure a signal relating to a coupling capacitance between said functional head and a nearby object (OP).

13. The robot according to claim 12, characterized in that it comprises at least one electrical item (Mo) arranged in the functional head, and for at least one item, a guard volume or walls, placed around said at least one item (Mo).

14. The robot according to claim 13, characterized in that it comprises, in the functional head, at least one electrical item electrically polarized at, or referenced to, the guard potential ($V_G$) by the at least one polarization means, so as to be electrically guarded at the guard potential ($V_G$).

15. The robot according to claim 1, characterized in that all of the electrical items arranged in said robot are electrically guarded at the guard potential ($V_G$).

16. The robot according to claim 1, characterized in that it has one of the following forms: robotized arm, mobile robot, vehicle on wheels or tracks, robot of the humanoid, or gynoid or android type.

* * * * *